United States Patent
Nishikawa et al.

(10) Patent No.: US 6,375,477 B2
(45) Date of Patent: Apr. 23, 2002

(54) ELECTRONIC DEVICE WITH CONNECTOR AND METHOD OF MANUFACTURING THE SAME

(75) Inventors: Hisashi Nishikawa, Shiga; Ichiro Tateishi, Fukui; Masahide Onishi, Fukui; Yoshiyuki Nakade, Fukui, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/766,679

(22) Filed: Jan. 23, 2001

(30) Foreign Application Priority Data

Jan. 24, 2000 (JP) .......................................... 2000-014503

(51) Int. Cl.[7] .............................................. H01R 12/00
(52) U.S. Cl. ...................................... 439/76.1; 439/76.2
(58) Field of Search ............................... 439/76.1, 76.2, 439/573

(56) References Cited

U.S. PATENT DOCUMENTS

| | | | | |
|---|---|---|---|---|
| 5,023,752 A | * | 6/1991 | Detter et al. ................. | 361/399 |
| 5,443,390 A | * | 8/1995 | Kokkosoulis et al. ...... | 439/76.1 |
| 5,764,487 A | * | 6/1998 | Natsume ..................... | 361/775 |
| 6,106,307 A | * | 8/2000 | Goslicki, Jr. et al. ...... | 439/76.1 |
| 6,152,758 A | * | 11/2000 | Matsuoka ................... | 439/364 |

FOREIGN PATENT DOCUMENTS

JP  2000215936 A  *  8/2000

* cited by examiner

Primary Examiner—Gary Paumen
(74) Attorney, Agent, or Firm—McDermott, Will & Emery

(57) ABSTRACT

The invention comprises a case having an opening, electronic parts and a wiring board installed in the case, a connector plug body fixed to the case, and a lid disposed in the opening of the case. The connector plug body has terminals and base. The terminals have an upper terminal projecting in upper direction from the base, and a lower terminal projecting from lower direction of the base. The lower terminal is electrically connected to the wiring board. The lid has a connector housing. The upper terminal projects into the connector housing. The base is fixed in the case, and hence the connector plug body is fixed to the case. The case has a connector fixing part projecting from the inner bottom of the case. The connector fixing part is positioned in lower direction of the connector housing, and the base is fixed in the connector fixing part. The connector housing is integrally formed with the lid. In this configuration, the connector area is reduced. The entire electronic device with connector is reduced in size. When manipulating the electronic device with connector, the stress applied to the wiring board is prevented. Deterioration of performance during manipulation is prevented, and an electronic device with connector having an excellent reliability is obtained.

24 Claims, 8 Drawing Sheets

ELECTRONIC DEVICE WITH CONNECTOR AND METHOD OF MANUFACTURING THE SAME

FIELD OF THE INVENTION

The present invention relates to an electronic device with connector, and more particularly to an electronic device with connector used in automobile or the like.

BACKGROUND OF THE INVENTION

An electronic device with connector is, for example, a rotational angle sensor for detecting the rotation extent of a steering wheel of an automobile. Such electronic device with connector is electrically connected with the car body side through a connector, and used in various detections and controls.

Such conventional electronic device with connector is explained below while referring to FIG. 7 and FIG. 8.

FIG. 7 shows a side sectional view of a conventional electronic device with connector, and FIG. 8 is its perspective exploded view. In FIG. 7 and FIG. 8, the electronic device with connector comprises a connector 1, a wiring board 3, plural electronic parts 4, a box case 6, and plural terminals 2. The connector 1 is made of an electric insulating resin. This connector 1 has a box housing 1A, an inner bottom 1B, and a mounting unit 1D. The box housing 1A has an upper opening. The plural terminals 2 are inserted in the inner bottom 1B, projecting in the vertical direction. The mounting unit 1D is formed at the left side of the housing 1A, projecting in the direction orthogonal to the projecting direction of the terminals 2. This mounting unit 1D has a tightening hole 1C.

The plural electronic parts 4 are mounted on the wiring board 3. The terminal 2 in the lower direction of the connector 1 is soldered and connected to the wiring board 3, and a screw 5 is tightened to the tightening hole 1C from beneath. Thus, the connector 1 is fixed to the wiring board 3.

The wiring board 3 is put in the box case 6, and the wiring board 3 is fixed to the case 6 by a screw 7. The upper opening of the case 6 is covered with a lid 8. The housing 1A of the connector 1 is projecting upward from the lid 8. In this way, the electronic device with connector is composed.

A manufacturing method of such conventional electronic device with connector is explained. Plural electronic parts 4 are mounted on the wiring board 3. Plural terminals 2 are blanked out into a specified shape one by one from a conductive metal plate. Each terminal of the plural terminals 2 is pressed into a terminal hole in the inner bottom 1B of the connector 1. The terminal 2 in the lower direction is soldered to the wiring board 3 on which the plural electronic parts are mounted.

From beneath the tightening hole 1C, the screw 5 is tightened, and the connector 1 is fixed to the wiring board 3. This wiring board 3 is fixed to the case 6 by the screw 7. The upper opening of the case 6 is covered with the lid 8, and this lid 8 is fixed to the case 6 by a screw or the like. Thus, the electronic device with connector is completed.

In the conventional electronic device with connector, however, since the connector 1 is fixed to the wiring board 3 by the tightening hole 1C of the mounting unit 1D projecting from the side of the housing 1A, the area of the connector 1 occupying the wiring board 3 is large. It was hence difficult to reduce the size of the entire electronic device. Further, when detaching the connector 1 from the connector unit mounted on the car body, the detaching force is applied to the wiring board 3. As a result, stress is applied to the wiring pattern of the wiring board 3 and mounted electronic parts 4. The conventional electronic device with connector had these problems.

SUMMARY OF THE INVENTION

An electronic device with connector of the invention comprises:
(a) a case having an opening,
(b) electronic parts and a wiring board installed in the case,
   the electronic parts being mounted on the wiring board,
(c) a connector plug body fixed to the case,
   the connector plug body having a terminal and a base,
   the terminal having an upper terminal projecting in upper direction from the base, and a lower terminal projecting in lower direction from the base, and
   the lower terminal being electrically connected to the wiring board, and
(d) a lid disposed in the opening of the case,
the lid having a connector housing, and
the upper terminal projecting into the connector housing,
in which the base is fixed to the case, and thereby the connector plug body is fixed to the case.

Preferably, the case has a connector fixing part projecting from the inner bottom of the case, the connector fixing part is positioned in lower direction of the connector housing, the base is fixed to the connector fixing part, and thereby the connector plug body is fixed to the case.

Preferably, the connector housing is formed integrally with the lid.

A manufacturing method of electronic device with connector of the invention comprises:
(a) a step of forming a a case having an opening,
(b) a step of forming a lid having a connector housing, the connector housing formed integrally with the lid,
(c) a step of forming a wiring board,
(d) a step of mounting electronic parts on the wiring board,
(e) a step of forming a connector plug body having metal terminals and resin base by insert-forming of metal material by using resin material,
(f) a step of connecting the terminals electrically to the wiring board,
(g) a step of fixing the connector plug body to the case by fixing the resin base to the case, and
(h) a step of installing the lid in the opening of the case.

Preferably, the case has a connector fixing part projecting from the inner bottom of the case, and the step (g) and step (h) include a step of fixing the base to the connector fixing part, so that the connector fixing part may be positioned in lower direction of the connector housing, and thereby the connector plug body is fixed to the case.

In this configuration, the area of the connector occupying on the wiring board is decreased. Further, the electronic device with connector is reduced in size. Moreover, stress is hardly applied on the wiring board 3 when detaching or attaching the electronic device with connector. Still more, the manufacturing cost is lowered.

Figure 1:
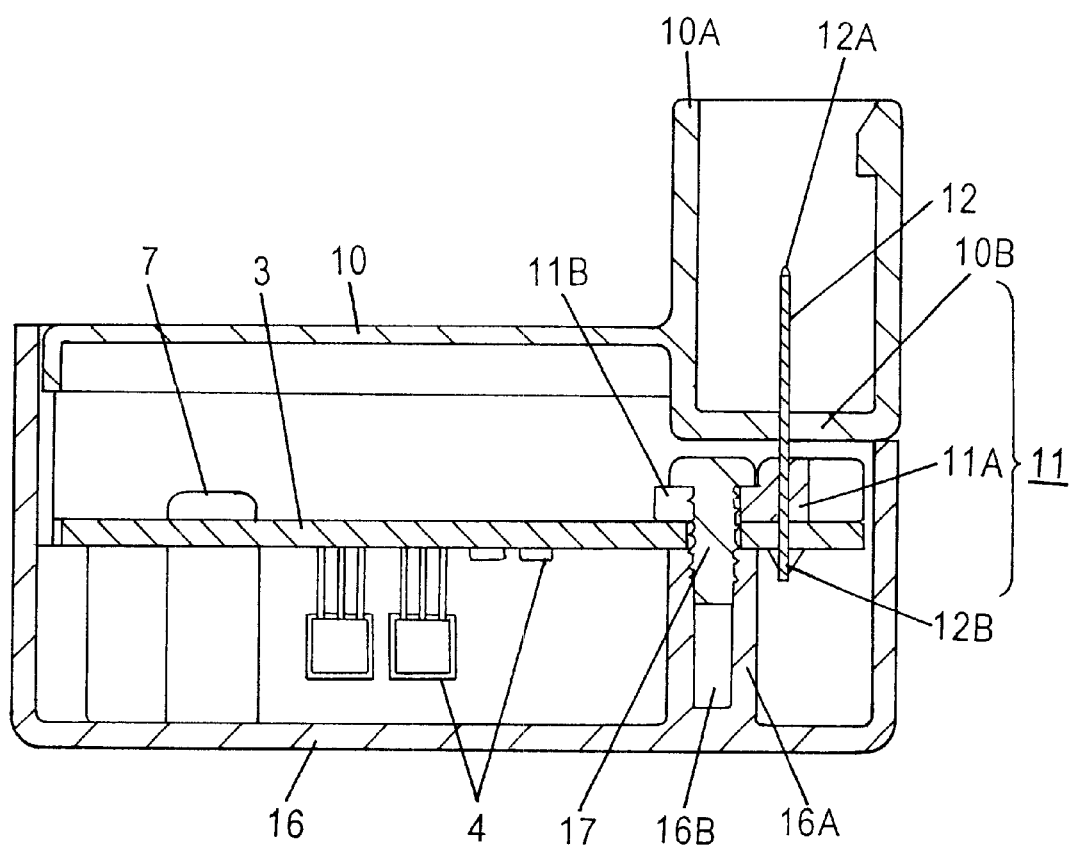
FIG. 1 is a side sectional view of an electronic device with connector in an exemplary embodiment of the invention.

REFERENCE NUMERALS 3, 3A, 3B Wiring board
4 Electronic part
7, 17 Screw
10 Lid
10A Connector housing
10B Inner bottom
11 Connector plug body
11A Resin base
11B Screw tightening part
12 Plural terminals
12A Upper terminal
12B Lower terminal
12C Coupling beam
13 Light emitting diode
14 Photo IC
15 Disk
16 Case
16A Connector fixing part
16B Tightening hole
16C Lid fixing part
17 Screw
17A Other screw
18 Jumper wire

DETAILED DESCRIPTION OF THE INVENTION

An electronic device with connector in an embodiment of the invention comprises a lid., a connector plug body, a case, a wiring board, and electronic parts. The electronic parts are mounted on the circuit board. The lid has an integrally formed connector housing. The connector housing has a box shape. The case is also shaped like a box, and has a connector fixing part and an upper opening. The wiring board mounting the electronic parts is put in the case. The connector plug body has a resin base and plural terminals. The plural terminals consist of an upper terminal projecting in upper direction from the resin base, and a lower terminal projecting in lower direction. The upper terminal is inserted into the inner bottom of the connector housing, and projects from its inner bottom. The lower terminal is inserted into the wiring board at the lower side of the connector housing or vicinal position, and projects from the bottom of the wiring board. The lower side of the wiring board abuts against the upper side of the connector fixing part, and the upper side of the wiring board abuts against the lower side of the resin base, so that the connector plug body is held in the connector fixing part. The lid is disposed to cover the upper opening of the case. Thus, the electronic device with connector is composed.

In this structure, the connector plug body forms the connector. Therefore, the area of the connector occupying on the wiring board is decreased. Further, the electronic device with connector is reduced in size. Moreover, when the connector of the electronic device with connector is attached to or detached from the connector at the car body side, all of attaching and detaching force is applied to the lid and case. Hence, stress applied to the wiring board is extremely decreased. That is, stress is hardly applied to the wiring board 3. As a result, an electronic device with connector having a high reliability of use is obtained.

Preferably, a tightening hole is formed in the upper side of the connector fixing part. The screw is tightened into the tightening hole while grabbing the connector plug body and wiring board. In this structure, the connector plug body and wiring board are securely held in the case by the screw.

Preferably, the resin base and terminals are integrally formed by insert-forming. Further preferably, in a direction orthogonal to the projecting direction of terminals, a screw tightening part in a nearly semicircular shape consecutive to the resin base is formed. In this structure, the connector plug body is securely and easily fixed to the case. Moreover, the die for manufacturing the connector plug body is easily prepared, and the connector plug body can be manufactured easily and at low cost.

Exemplary embodiments of the invention are described below while referring to FIG. 1 to FIG. 6.

Exemplary Embodiment 1

Figure 2:
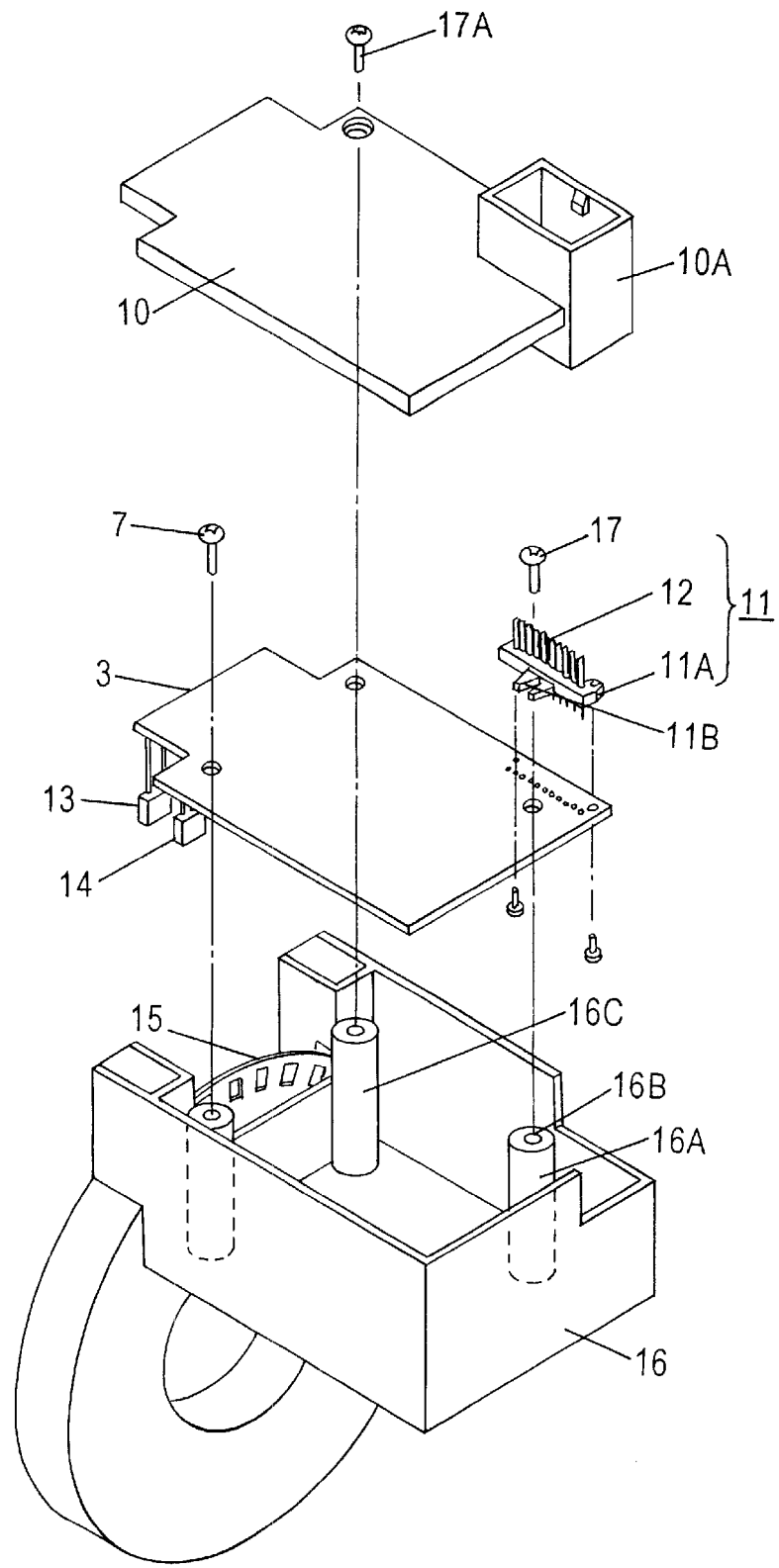
FIG. 2 is a perspective exploded view of the electronic device with connector shown in FIG. 1.

FIG. 1 is a side sectional view of an electronic device with connector in exemplary embodiment 1 of the invention, and FIG. 2 is a perspective exploded view of this electronic device with connector. The electronic device with connector of this exemplary embodiment 1 has a function as a rotational angle sensor.

In FIG. 1 and FIG. 2, the electronic device with connector comprises a lid 10, a connector plug body 11, a box-shaped case 16, a wiring board 3, and plural electronic parts 4.

The lid 10 includes a connector housing 10A. The connector housing 10A has an upper opening. The connector housing 10A is shaped like a box. The connector housing 10A is formed integrally with the lid 10. Preferably, the lid 10 having the connector housing 10A is an integral piece formed of resin.

The connector plug body 11 has a resin base 11A, a screw tightening part 11B, and plural terminals 12. The plural terminals 12 are conductive electrically, and are made of, for example, metal. Each terminal of the plural terminals 12 has an upper terminal 12A projecting in upper direction from the resin base 11A, and a lower terminal 12B projecting in lower direction. Preferably, the screw tightening part 11B has a nearly semicircular shape, and is formed consecutively to the resin base 11A in a direction orthogonal to the projecting direction of the terminals 12. The resin base part 11A, screw tightening part 11B, and plural terminals 12 are formed integrally by insert-forming. The plural terminals 12 are made of metal. The resin base 11A is made of an electric insulating resin. The connector plug body 11 is an integral form made of resin material by insert-forming of metal terminals.

The plural electronic parts 4 are mounted on the wiring board 3. For example, in the diagram, optical functional parts such as light-emitting diode 13 and photo IC 14 are mounted on the right region of the wiring board 3. The lower terminal 12B is soldered and connected to the left region of the wiring board 3. A disk 15 is disposed at a position between the right region and left region. The disk 15 has plural holes formed on its outer periphery.

A case 16 accommodates the wiring board 3. The case 16 has a connector fixing part 16A and a lid fixing part 16C, and the connector fixing part 16A projects from the inner bottom of the case 16. A tightening hole 16B is formed in the upper side of the connector fixing part 16A. The upper end of the connector fixing part 16A abuts against the lower side of the wiring board 3, and is located at a position in lower direction of the connector housing 10A. The lid 10 and case 16 are positioned, so that the upper side of the connector fixing part 16A may be positioned at the lower side of the connector housing 10A or near its lower side. A screw 17 is tightened into the tightening hole 16B by penetrating through the wiring board from the upper side of the screw tightening part 11B. Thus, by the screw 17, the connector plug body 11 and wiring board 3 are held and fixed in the case 16.

The lid 10 is disposed to cover the opening of the case 16. Preferably, the lid 10 is fixed to the lid fixing part 16C of the case 16 by means of the screw 17A and others. In this way, the electronic device with connector is composed.

The terminals 12 of this electronic device with connector are electrically connected to the connector installed in the car body. In this state, when the steering wheel (not shown) of the automobile is manipulated, the disk 15 rotates in cooperation with this steering wheel manipulation. By the number of holes formed on the outer periphery of the disk 15, at least one optical functional part of the light-emitting diode 13 and photo IC 14 detects the extent of rotation. Thus, the electronic device with connector is composed as a rotational angle sensor.

Figure 3:
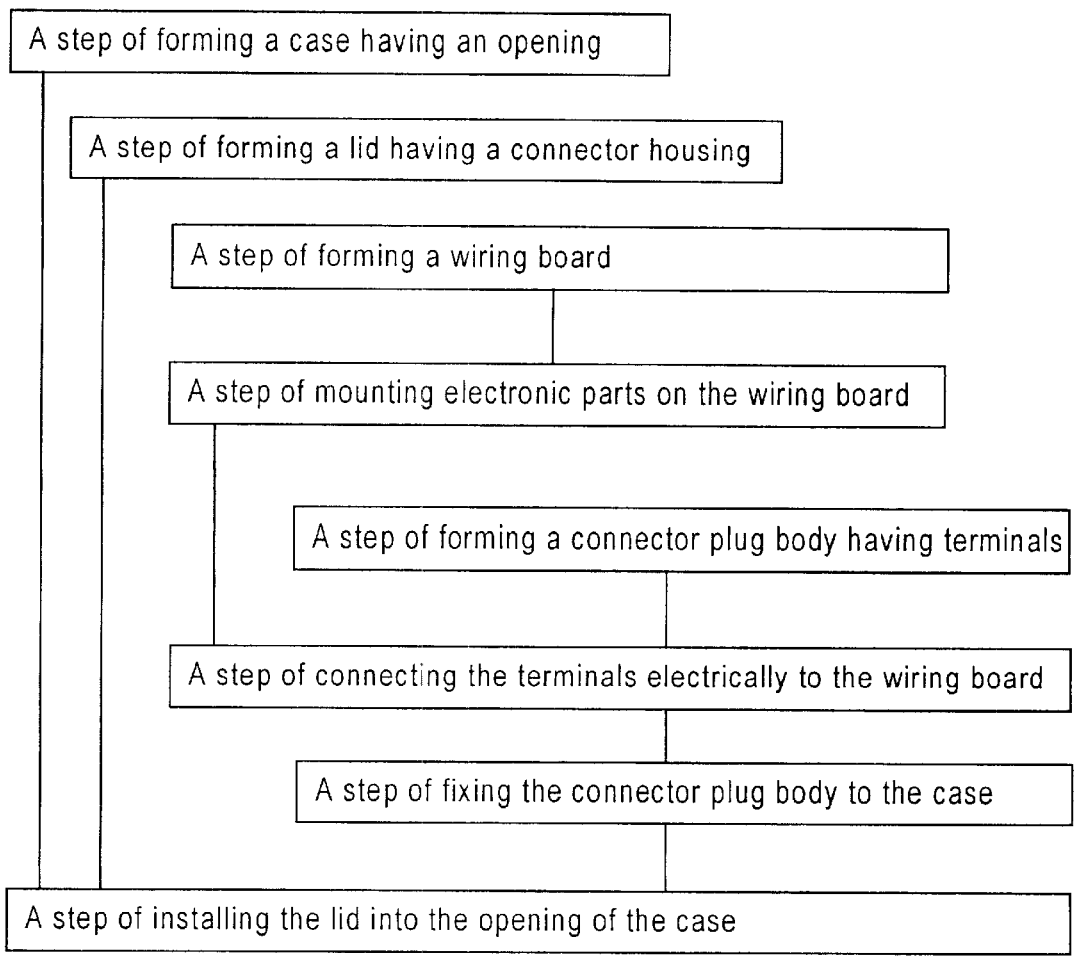
FIG. 3 shows a manufacturing process of the electronic device with connector in the exemplary embodiment of the invention.

A manufacturing method of the electronic device with connector having such configuration is explained below. FIG. 3 shows a manufacturing process of the electronic device with connector in the exemplary embodiment of the invention.

As shown in FIG. 3, the manufacturing process of the electronic device with connector in the exemplary embodiment of the invention comprises:

(a) a step of forming a a case having an opening, (b) a step of forming a lid having a connector housing, (c) a step of forming a wiring board, (d) a step of mounting electronic parts on the wiring board, (e) a step of forming a connector plug body having terminals, (f) a step of connecting the terminals electrically to the wiring board, (g) a step of fixing the connector plug body to the case, and (h) a step of installing the lid in the opening of the case.

Figure 4:
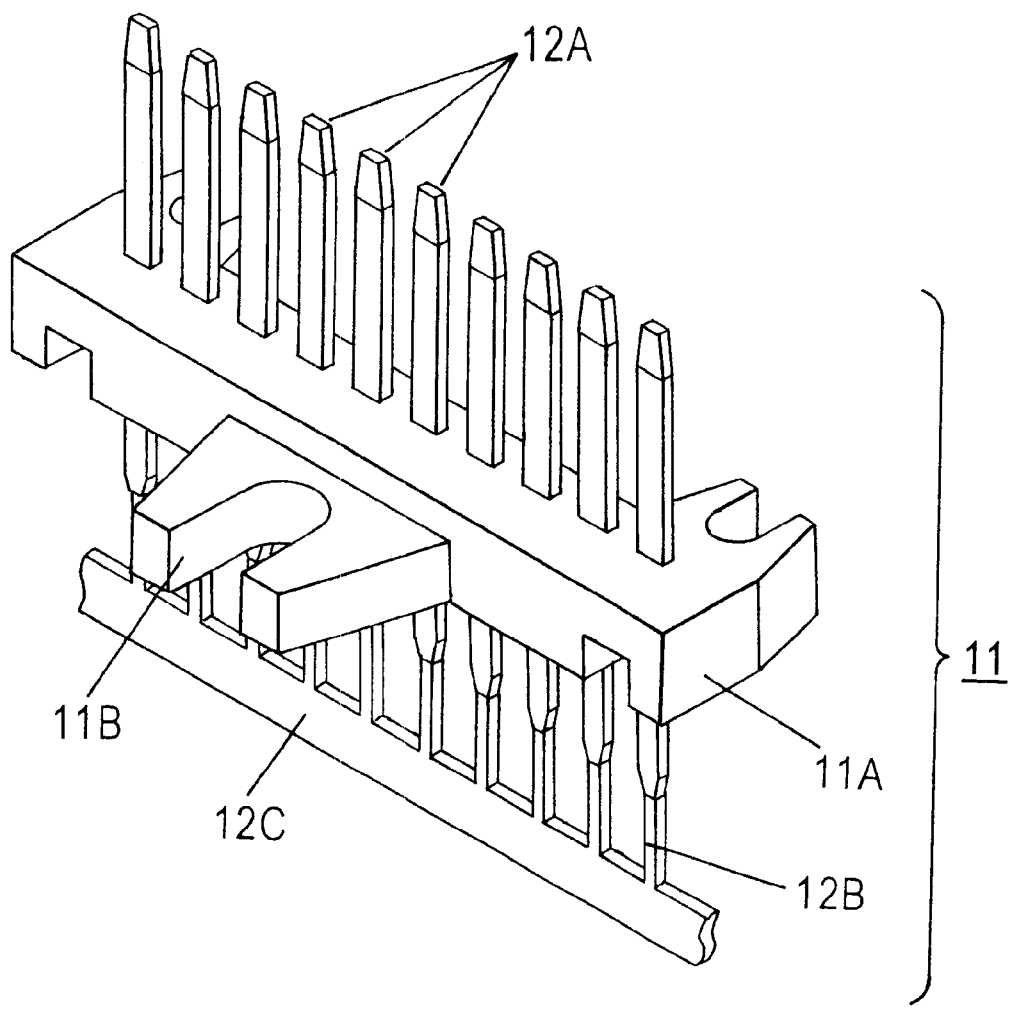
FIG. 4 is a perspective view of connector plug body in the manufacturing process of the electronic device with connector in the exemplary embodiment of the invention.

FIG. 4 is a perspective view of connector plug body in the manufacturing process of the electronic device with connector in the exemplary embodiment. As shown in FIG. 4, by blanking out a hoop of conductive metal plate, plural terminals 12 coupled by a coupling beam 12C are formed. By insert-forming of the plural terminals 12 and resin, a resin base 11A is formed. In this case, the upper terminal 12A of the plural terminals 12 projects in upper direction from the resin base 11A, and the lower terminal 12B projects in lower direction from the resin base 11A. Later, the coupling beam 12C is cut off. Thus, the connector plug body 11 is manufactured.

In this integral forming, the screw tightening part 11B is formed in the side surface of the resin base 11A. The screw tightening part 11B is formed in a direction orthogonal to the projecting direction of the terminals 12. Preferably, the screw tightening part 11B has a nearly semicircular shape. As the screw tightening part 11B has a nearly semicircular shape, a die having a simple structure splittable in two directions, forward and backward, can be used as the die for insert-forming. As a result, the connector plug body 11 can be manufactured easily.

On the other hand, plural electronic parts 4 are mounted on the wiring board 3. Further, the case 16 having the connector fixing part 16A is manufactured. The lid 10 having the connector housing 10A is manufactured. The lid 10 and case 16 are formed so that the upper side of the connector fixing part 16A may be positioned at the lower side of the connector housing 10A or near its lower side.

Next, by the screw or the like, the connector plug body 11 is temporarily fixed to the wiring board 3, and the lower terminal 12B is soldered to the wiring board 3 mounting plural electronic parts 4.

Then, the upper side of the projecting connector fixing part 16A is positioned at the lower side of the connector housing 10A. The screw 17 is fixed in the tightening hole 16B formed in the connector fixing part 16A through the screw tightening part 11B and wiring board 3. Thus, the connector plug body 11 and wiring board 3 are held and fixed in the case 16.

Consequently, the left end of the wiring board 3 is fixed to the case 16 by other screw 7. The upper opening of the case 16 is disposed to cover the lid 10. This lid 10 is fixed in the lid fixing part 16C of the case 16 by the screw 17A and others. Thus, the electronic device with connector is completed.

In the electronic device with connector of this exemplary embodiment, the lid 10 has the connector housing 10A. That is, the lid 10 and connector housing 10A are formed integrally. In this structure, the electronic device with connector can be easily reduced in size.

Further, the connector plug body 11 is fixed directly to the case 16. In this structure, when the electronic device with connector is attached to or detached from the connector of the car body, all of attaching and detaching.force is applied to the lid 10 and case 16, and the attaching and detaching force is not applied to the wiring board 3. It hence prevents stress applied to the wiring board by attaching or detaching of the electronic device with connector. Deterioration of performance by manipulation is prevented. As a result, an electronic device with connector having a high reliability of use is obtained.

The connector fixing part 16A has the tightening hole 16B formed on the upper side. By tightening the screw 17 into the tightening hole 16B while grabbing the connector plug body 11 and wiring board 3, the connector plug body 11 and wiring board 3 are securely held in the case 16. As a result, an electronic device with connector having a high reliability of use is obtained.

Moreover, in the process of forming the connector plug body 11 by insert-forming of the resin base 11A and terminals 12, and forming a nearly semicircular screw tightening part 11B in a direction orthogonal to the projecting direction of the terminals of the resin base 11A, the step of forming the connector plug body 11 integrally is made easier, and the die is easier to prepare. Hence the manufacturing cost is lower.

In this exemplary embodiment, as the case 16 is designed to tighten the screw tightening hole 16B formed in the connector fixing part 16A projecting from the inner bottom and the screw 17 in this tightening hole 16B, the connector plug body 11 and wiring board 3 are held and fixed in the case 16. Instead of such structure, the following fixing structure is also possible. That is, instead of the tightening hole 16B and screw 17, the connector fixing part 16A has a first engaging part such as pawl formed on the upper side thereof, the wiring board 3 has a second engaging part such as hole or notch, and this first engaging part is inserted into the second engaging part, and the leading end of the first engaging part is press-fitted and arrested in the resin base 11A. Thus, the connector plug body 11 and wiring board 3 are held and fixed in the case 16. In such various modes of fixing structure, the connector plug body 11 and wiring board 3 are held and fixed in the case 16.

Exemplary Embodiment 2

Figure 5:
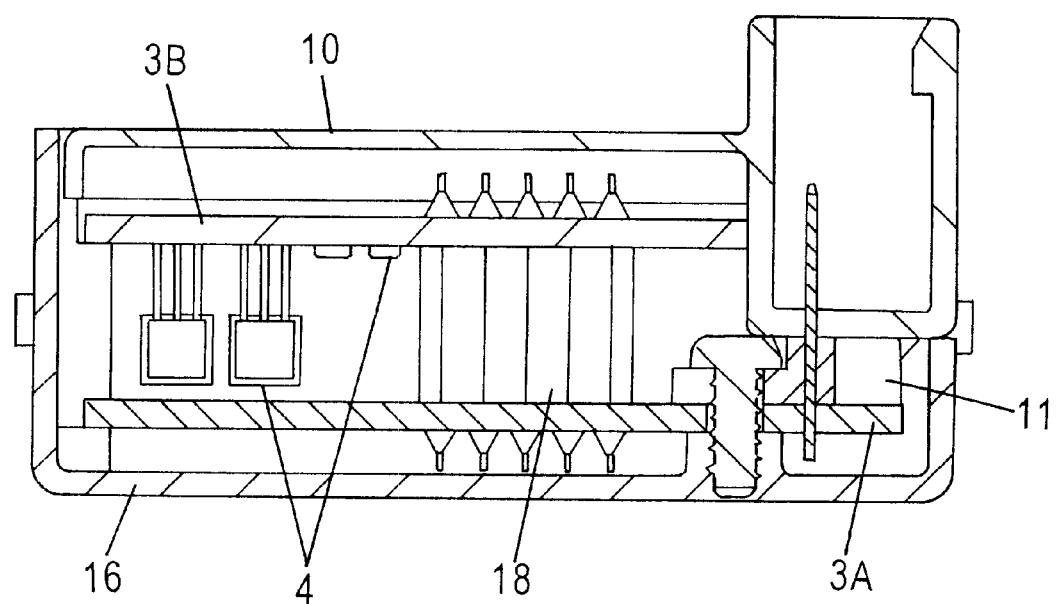
FIG. 5 is a side sectional view of an electronic device with connector in other exemplary embodiment of the invention.
Figure 6:
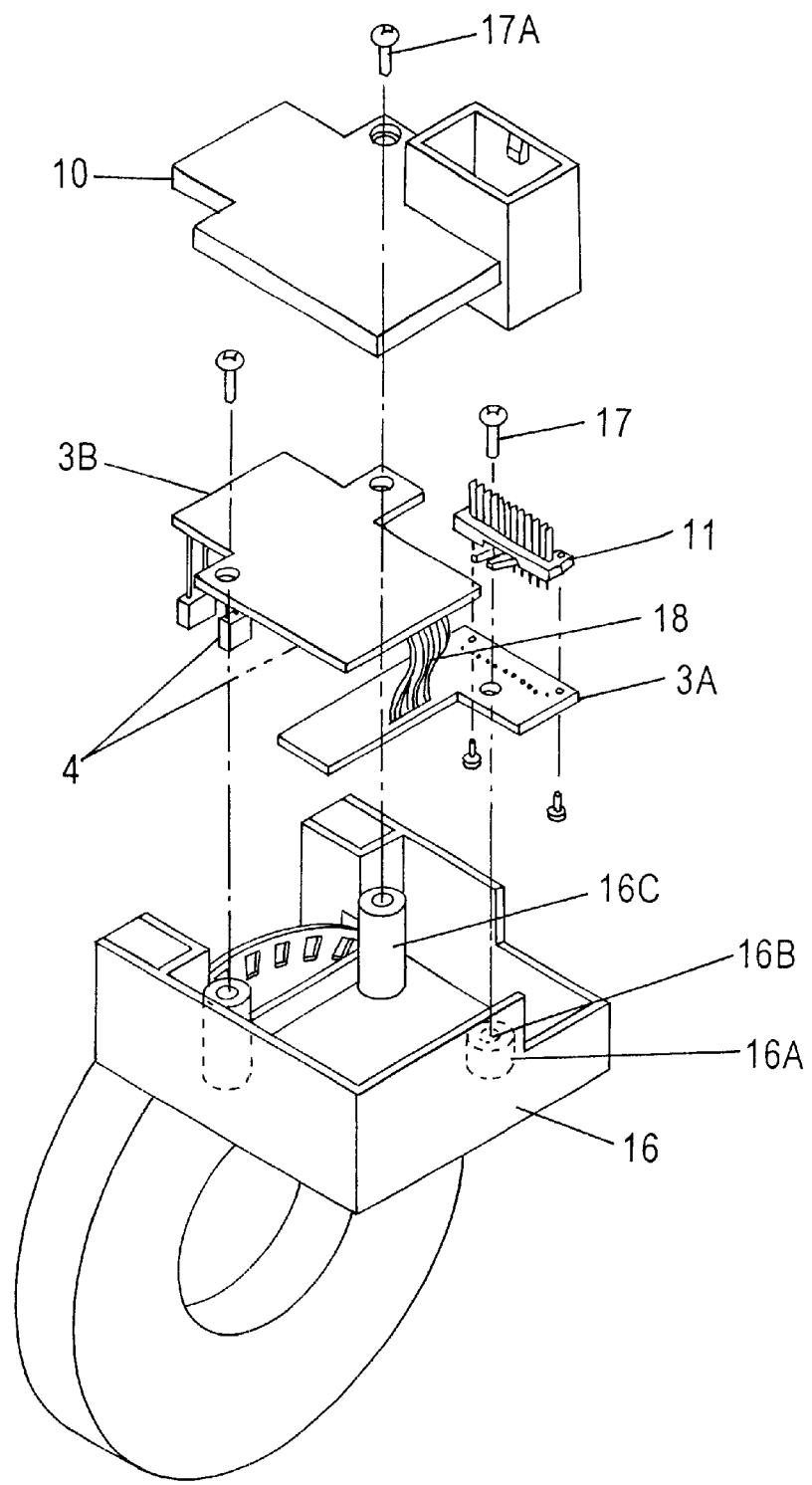
FIG. 6 is a perspective exploded view of the electronic device with connector shown in FIG. 5.
Figure 7:
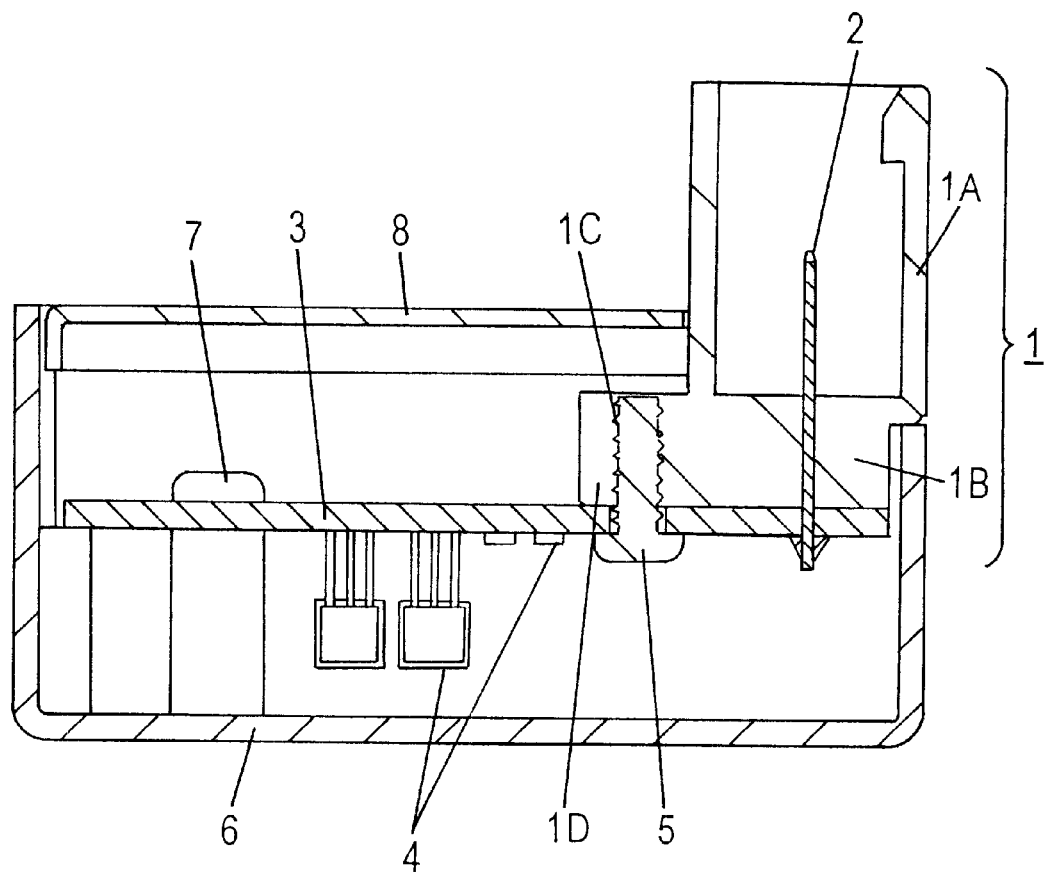
FIG. 7 is a side sectional view of a conventional electronic device with connector.
Figure 8:
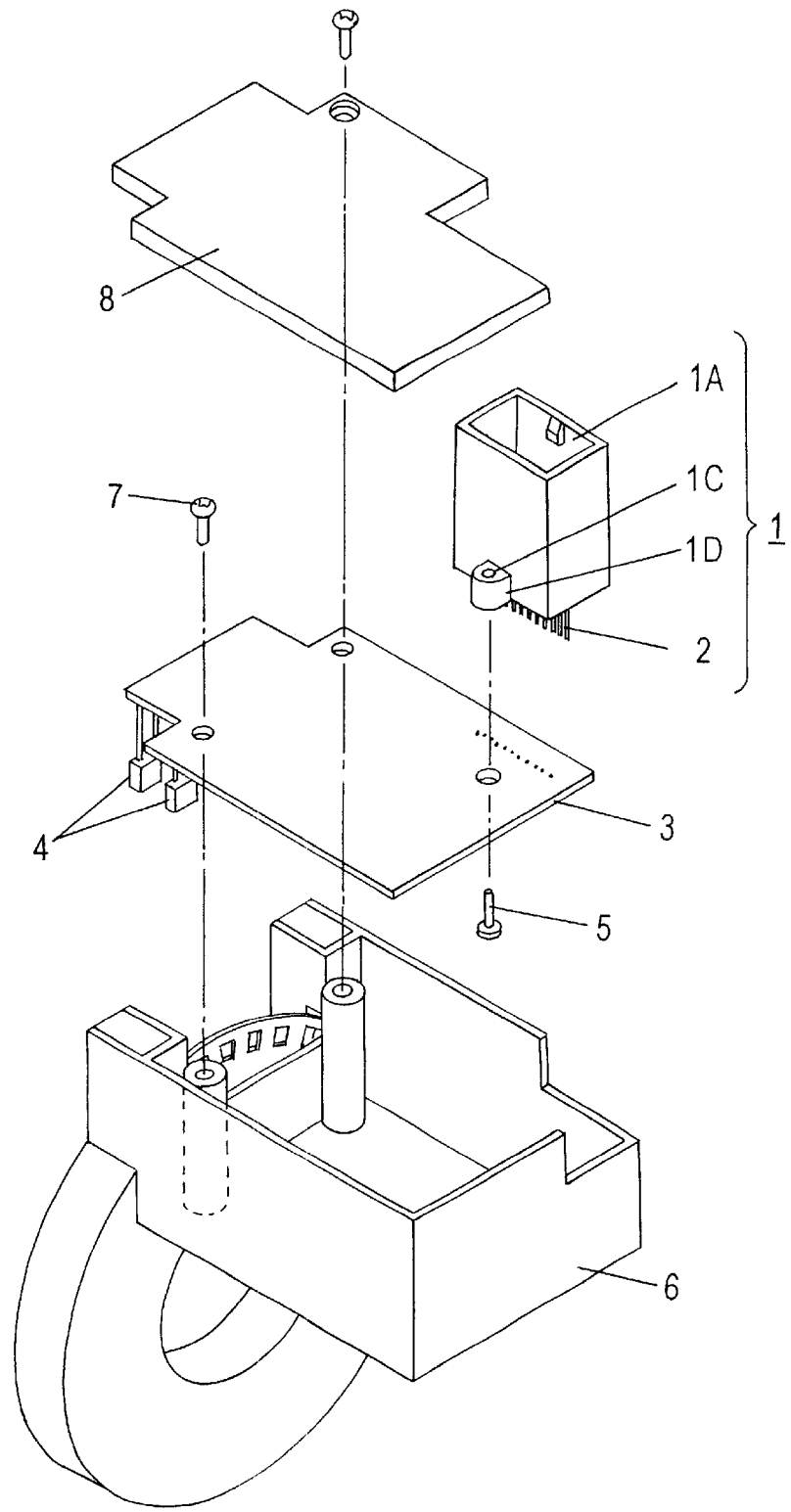
FIG. 8 is a perspective exploded view of the conventional electronic device with connector.

FIG. 5 is a side sectional view of an electronic device with connector in exemplary embodiment 2 of the invention, and FIG. 6 is a perspective exploded view of this electronic device with connector.

The electronic device with connector in exemplary embodiment 1 has one wiring board 3. By contrast, the electronic device with connector of this exemplary embodiment 2 has two wiring boards. Or, the electronic device with connector of exemplary embodiment 2 has the wiring board divided into two parts. That is, in FIG. 5 and FIG. 6, the case 16 contains a first wiring board 3A and a second wiring board 3B. The connector plug body 11 is connected to the first wiring board 3A. On the second wiring board 3B, plural electronic parts 4 susceptible to stress are mounted at arbitrary positions. Other plural electronic parts 4 are mounted on the first wiring board 3A. The first wiring board 3A and second wiring board 3B are positioned at a specific interval, and are mutually connected by means of a flexible jumper wire 18. The connector plug body 11 has a same configuration as the preceding exemplary embodiment 1. The case 16 has a connector fixing part 16A and a lid fixing part 16C. The connector fixing part 16A has a tightening hole 16B. The first wiring board 3A is held and fixed in the case 16 together with the connector plug body 11, by means of a screw 17. The second wiring board 3B is fixed to the lid fixing part 16C of the case 16, together with the lid 10, by means of other screw 17A. The other constitution is same as in exemplary embodiment 1.

In this constitution, the same effects as explained in exemplary embodiment 1 are obtained. Further, the stress given to the electronic parts 4 can be securely prevented. Moreover, since the plural electronic parts can be mounted at arbitrary positions on the second wiring board, the electronic device with connector reduced in size can be obtained.

Thus, according to the invention, the area of the connector is reduced. The entire electronic device with connector can be reduced in size. When manipulating the electronic device with connector, stress given to the wiring board is prevented. Deterioration of performance during manipulation is prevented, and the electronic device with connector excellent in reliability is obtained.

What is claimed is:

1. An electronic device with connector comprising:
   (a) a case having an opening,
   (b) electronic parts and a wiring board installed in said case, said electronic parts being mounted on said wiring board,
   (c) a connector plug body fixed to said case, said connector plug body having a terminal and a base, said terminal having an upper terminal projecting in an upper direction from said base, and a lower terminal projecting in a lower direction from said base, and said lower terminal being electrically connected to said wiring board, and
   (d) a lid disposed in said opening of said case, said lid having a connector housing, and said upper terminal projecting into said connector housing, wherein said base is fixed to said case, and thereby said connector plug body is fixed to said case.

2. The electronic device with connector of claim 1, wherein said connector housing is shaped like a box, having an upper opening, and
said lower terminal projects from the inner bottom of said box-shaped connector housing.

3. The electronic device with connector of claim 1, wherein said terminal has plural terminals made of metal, said base is a resin base made of resin,
said connector plug body is an integral form of said plural terminals and resin base, and
said plural terminals are fixed to said resin base.

4. The electronic device with connector of claim 1, wherein said connector housing is formed integrally with said lid.

5. The electronic device with connector of claim 1, wherein the electronic device with connector is a rotational angle sensor, and
said electronic part has (I) at least one of optical functional parts of light-emittig diode and photo IC, and (ii) a disk having plural through-holes disposed near said optical functional part.

6. The electronic device with connector of claim 1, wherein said case has a connector fixing part projecting from the inner bottom of the case,
said connector fixing part is positioned in a lower direction of said connector housing, and
said base is fixed to said connector fixing part, so that said connector plug body is fixed to said case.

7. The electronic device with connector of claim 6, wherein the lower side of said wiring board abuts against the upper side of said connector fixing part, so that said wiring board is held in said case.

8. The electronic device with connector of claim 6, wherein the lower side of said wiring board abuts against the upper side of said connector fixing part, and
the upper side of said wiring board abuts against the lower side of said base, so that said connector plug body is held in said wiring board and said case.

9. The electronic device with connector of claim 6, wherein said connector fixing part has a first engaging part formed on the upper side of the connector fixing part,
said wiring board has a second engaging part,
said base has a third engaging part,
said wiring board is positioned between said upper side of said connector fixing part and said connector plug body, and
said first engaging part is engaged with said third engaging part by way of the second engaging part, so that said connector plug body is fixed in said case.

10. The electronic device with connector of claim 6, further comprising:
a screw,
wherein said connector fixing part has a tightening hole formed in the upper side of this connector fixing part,
said base has a screw tightening part,
said wiring board is positioned between said upper side of said connector fixing part and said base, and
said screw is tightened and fixed in said tightening hole by grabbing said wiring board from upper direction of said screw tightening part.

11. The electronic device with connector of claim 10,
wherein said screw tightening part has a nearly semicircular shape formed in said base in a direction orthogonal to said terminal, and said screw is tightened and fixed in said tightening hole by grabbing said wiring board from upper direction of said screw tightening part.

12. An electronic device with connector comprising:

(a) a case having an opening, (b) electronic parts and a wiring board installed in said case, said electronic parts being mounted on said wiring board, (c) a connector plug body fixed to said case, said connector plug body having a terminal and a base, said terminal having an upper terminal projecting in an upper direction from said base, and a lower terminal projecting in a lower direction from said base, and said lower terminal being electrically connected to said wiring board, and (d) a lid disposed in said opening of said case, said lid having a connector housing, and said upper terminal projecting into said connector housing, wherein said connector housing is formed integrally with said lid.

13. The electronic device with connector of claim 12,
wherein said connector housing is shaped like a box, having an upper opening, and said lower terminal projects from the inner bottom of said box-shaped connector housing.

14. The electronic device with connector of claim 12,
wherein said terminal has plural terminals made of metal, said base is a resin base made of resin, said connector plug body is an integral form of said plural terminals and resin base, and said plural terminals are fixed to said resin base.

15. The electronic device with connector of claim 12,
wherein said base is fixed to said case, so that said connector plug body is fixed to said case.

16. The electronic device with connector of claim 12,
wherein said case has a connector fixing part projecting from the inner bottom of the case, said connector fixing part is positioned in lower direction of said connector housing, and said base is fixed to said connector fixing part, so that fixing said connector plug body to said case.

17. The electronic device with connector of claim 16,
wherein the lower side of said wiring board abuts against the upper side of said connector fixing part, and the upper side of said wiring board abuts against the lower side of said base, so that said connector plug body is held on said wiring board and said case.

18. An electronic device with connector comprising:

(a) a box-shaped case having an opening, said case having a connector fixing part projecting from the inner bottom of the case, (b) electronic parts and a wiring board installed in said case, said electronic parts being mounted on said wiring board, (c) a connector plug body fixed to said case, said connector plug body having plural metal terminals and a resin base, said plural metal terminals having plural upper terminals projecting in an upper direction from said base, and plural lower terminals projecting in a lower direction from said base, said connector plug body being integrally formed with said plural metal terminals and resin base, and said lower terminals being electrically connected to said wiring board, and (d) a lid disposed in said opening of said case, said lid having a box-shaped connector housing, and said connector housing being integrally formed in said lid, wherein said plural metal terminals project from the inner bottom of said connector housing, said connector fixing part is positioned in a lower direction of said connector housing, and the lower side of said wiring board abuts against the upper side of said connector fixing part, said base is fixed to said case, so that said connector plug body is fixed to said case.

19. The electronic device with connector of claim 18, further comprising:

a screw, wherein said connector fixing part has a tightening hole formed in the upper side of this connector fixing part, said base has a screw tightening part, said wiring board is positioned between said upper side of said connector fixing part and said base, and said screw is tightened and fixed in said tightening hole by grabbing said wiring board from upper direction of said screw tightening part.

20. The electronic device with connector of claim 19,
wherein said connector plug body is an insert-forming body of said plural terminals and resin base, said screw tightening part has a nearly semicircular shape formed in said base, in a direction orthogonal to said terminals, and said screw is tightened and fixed in said tightening hole by grabbing said wiring board from upper direction of said screw tightening part.

21. An electronic device with connector comprising:

(a) a case having an opening, (b) plural electronic parts and plural wiring boards installed in said case, said plural wiring boards having a first wiring board and a second wiring board, said plural electronic parts having a first electronic part and a second electronic part, said first electronic part being mounted on said first wiring board, and said second electronic part being mounted on said second wiring board, (c) a connector plug body fixed to said case, said connector plug body having a terminal and a base, said terminal having an upper terminal projecting in an upper direction from said base, and a lower terminal projecting in a lower direction from said base, and said lower terminal being electrically connected to said first wiring board, and (d) a lid disposed in said opening of said case, said lid having a connector housing, and said upper terminal projecting into said connector housing, wherein said base is fixed to said case in a state of grabbing said first wiring board, so that fixing said connector plug body to said case, and said second wiring board is fixed to said case.

22. The electronic device with connector of claim 21, wherein said connector housing is formed integrally with said lid.

23. The electronic device with connector of claim 21, wherein said case has a connector fixing part projecting from the inner bottom of the case, said connector fixing part is positioned in lower direction of said connector housing, and said base is fixed to said connector fixing part, so that said connector plug body is fixed to said case.

24. The electronic device with connector of claim 21, further comprising:

a disk having plural through-holes, said disk being disposed near said first wiring board, wherein said first electronic part is at least one of optical functional parts of light-emittig diode and photo IC, and said disk and optical function part have a function of detecting the number of revolutions of said disk.

\* \* \* \* \*